United States Patent [19]
Le Roux

[11] Patent Number: 5,208,533
[45] Date of Patent: May 4, 1993

[54] NMR MACHINE WITH LOW FIELD AND DYNAMIC POLARIZATION

[75] Inventor: Patrick Le Roux, Gif sur Yvette, France

[73] Assignee: General Electric CGR S.A., Yvette, France

[21] Appl. No.: 671,696

[22] PCT Filed: Sep. 22, 1989

[86] PCT No.: PCT/FR89/00485
§ 371 Date: Mar. 29, 1991
§ 102(e) Date: Mar. 29, 1991

[87] PCT Pub. No.: WO90/03583
PCT Pub. Date: Apr. 5, 1990

[30] Foreign Application Priority Data
Sep. 30, 1988 [FR] France .................. 88 12836

[51] Int. Cl.[5] .............................................. G01V 3/00
[52] U.S. Cl. ...................................... 324/307; 324/309
[58] Field of Search ............. 324/300, 307, 309, 313, 324/314, 320

[56] References Cited
U.S. PATENT DOCUMENTS
4,887,034 12/1989 Smith .................... 324/307
5,057,776 10/1991 Macovski ............... 324/309

FOREIGN PATENT DOCUMENTS
0117042 8/1984 European Pat. Off. .
0198748 10/1986 European Pat. Off. .
3125502 1/1983 Fed. Rep. of Germany .
2128745 5/1984 United Kingdom .
2210982 6/1989 United Kingdom .

OTHER PUBLICATIONS
Patent Abstracts of Japan, vol. 10, No. 389 (P-531) (2446), Dec. 26, 1986, & JP, A, 61176842 (Mitsubishi Electric Corp.) Aug. 8, 1986.

Primary Examiner—Louis Arana
Attorney, Agent, or Firm—Nilles & Nilles

[57] ABSTRACT

Problems of homogeneity of the resonant field of an NMR machine are solved by differentiating the polarization and resonance functions assigned to coils of the field of said machine. In order to produce a magnetization, use is made of a polarization coil which produces a high field. This polarization field does not need to be homogeneous. Before making measurements, during sequences of excitation-measurement of the electromagnetic wave within the body under examination, the polarization field is switched in order to be cancelled and the body is subjected to a resonance field. This resonance field can be of much lower strength but is on the other hand much more homogeneous. By thus making use of switching of the orienting field, it is shown that the signal-to-noise ratio of the detected signal is maintained.

26 Claims, 4 Drawing Sheets

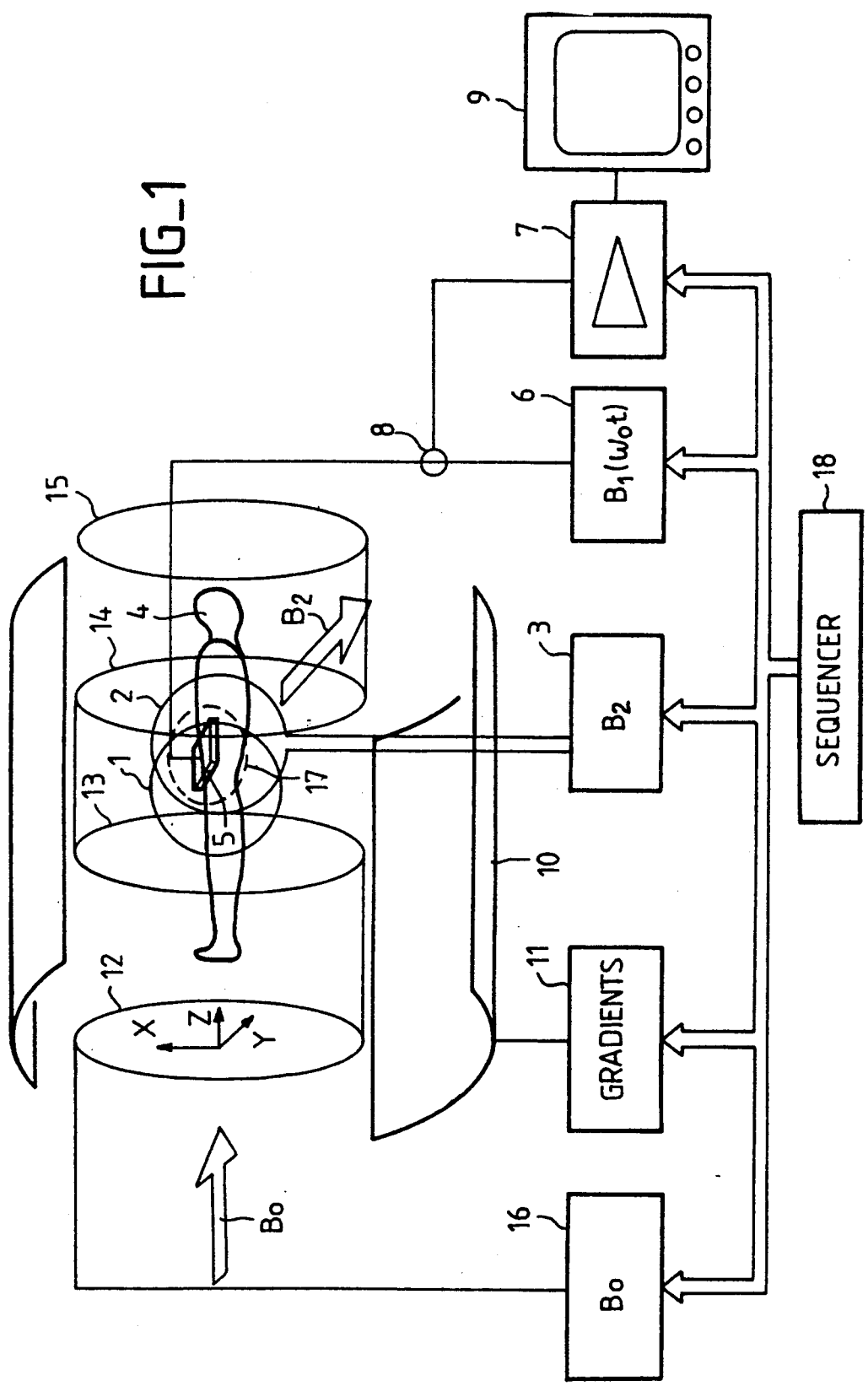

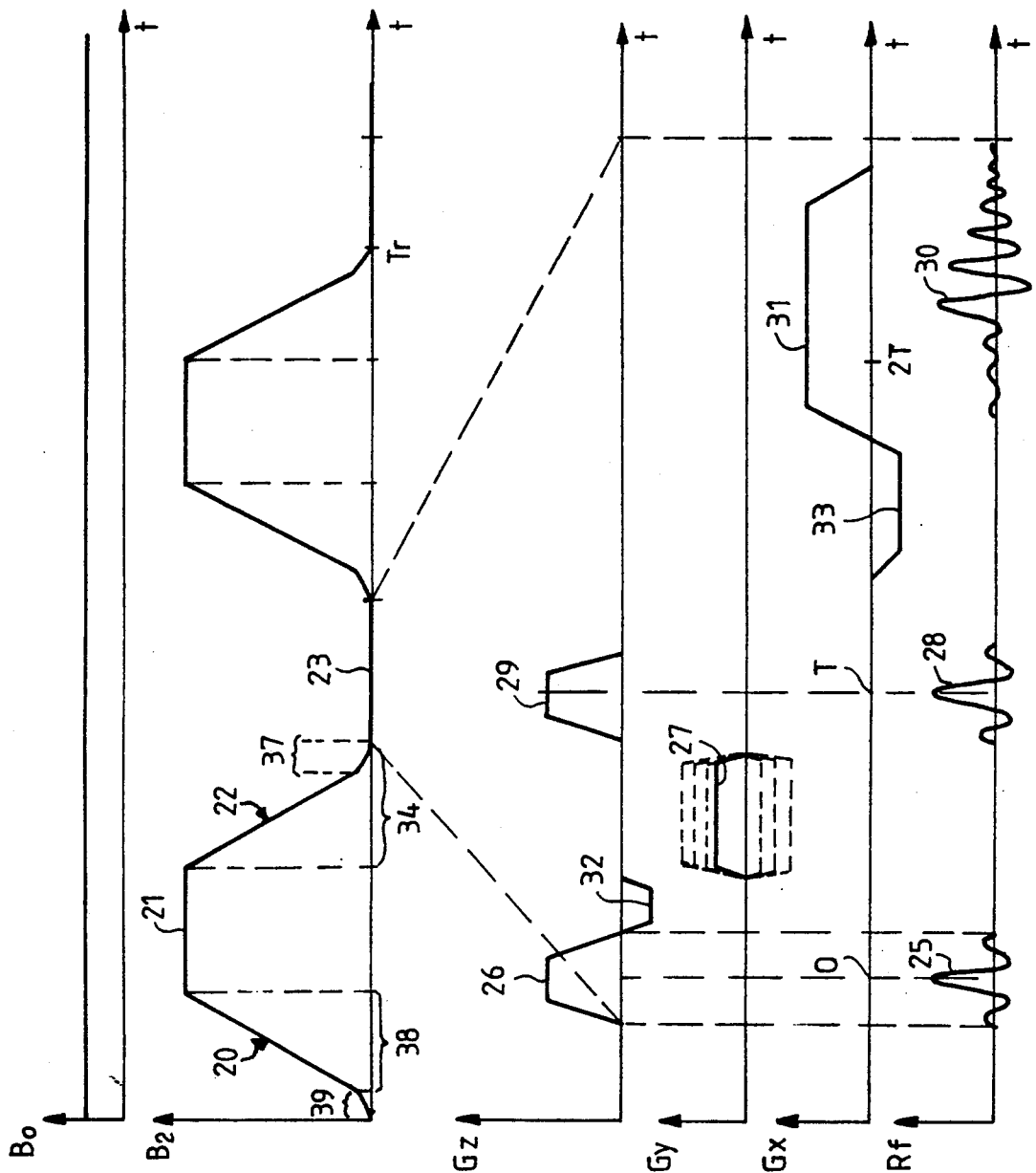

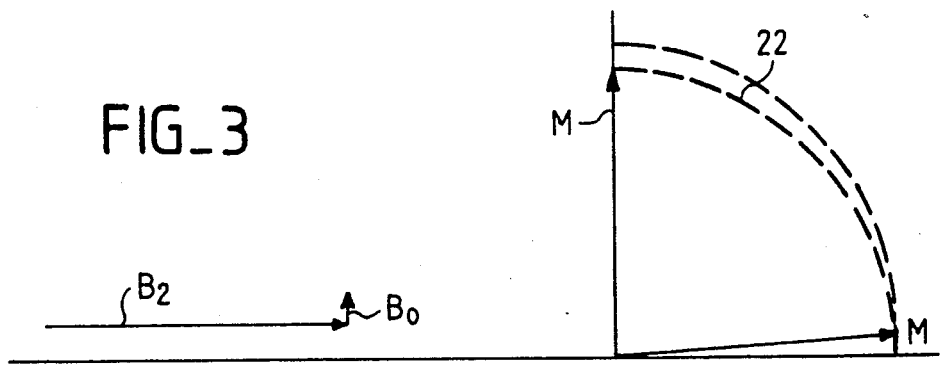
FIG_3
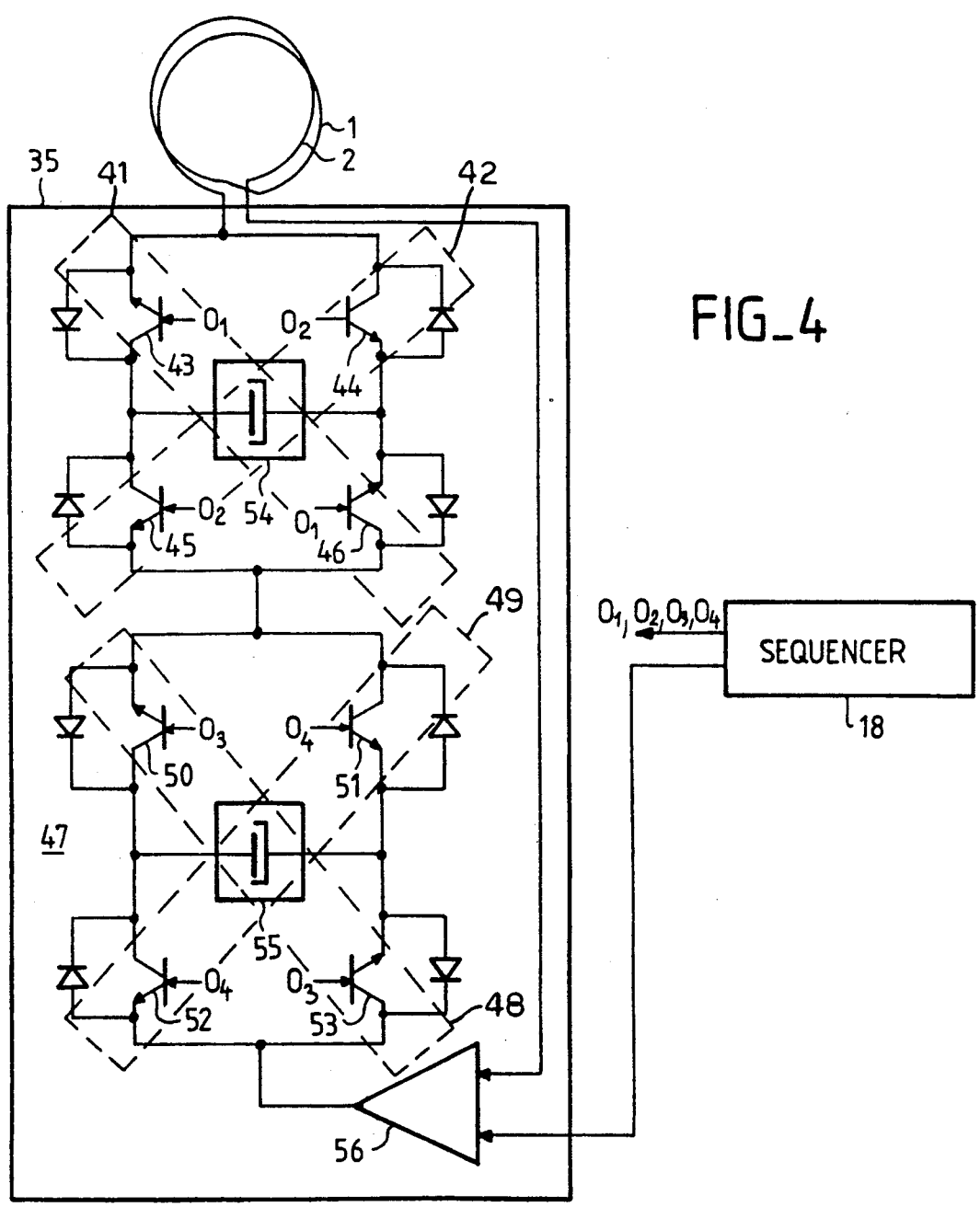
FIG_4

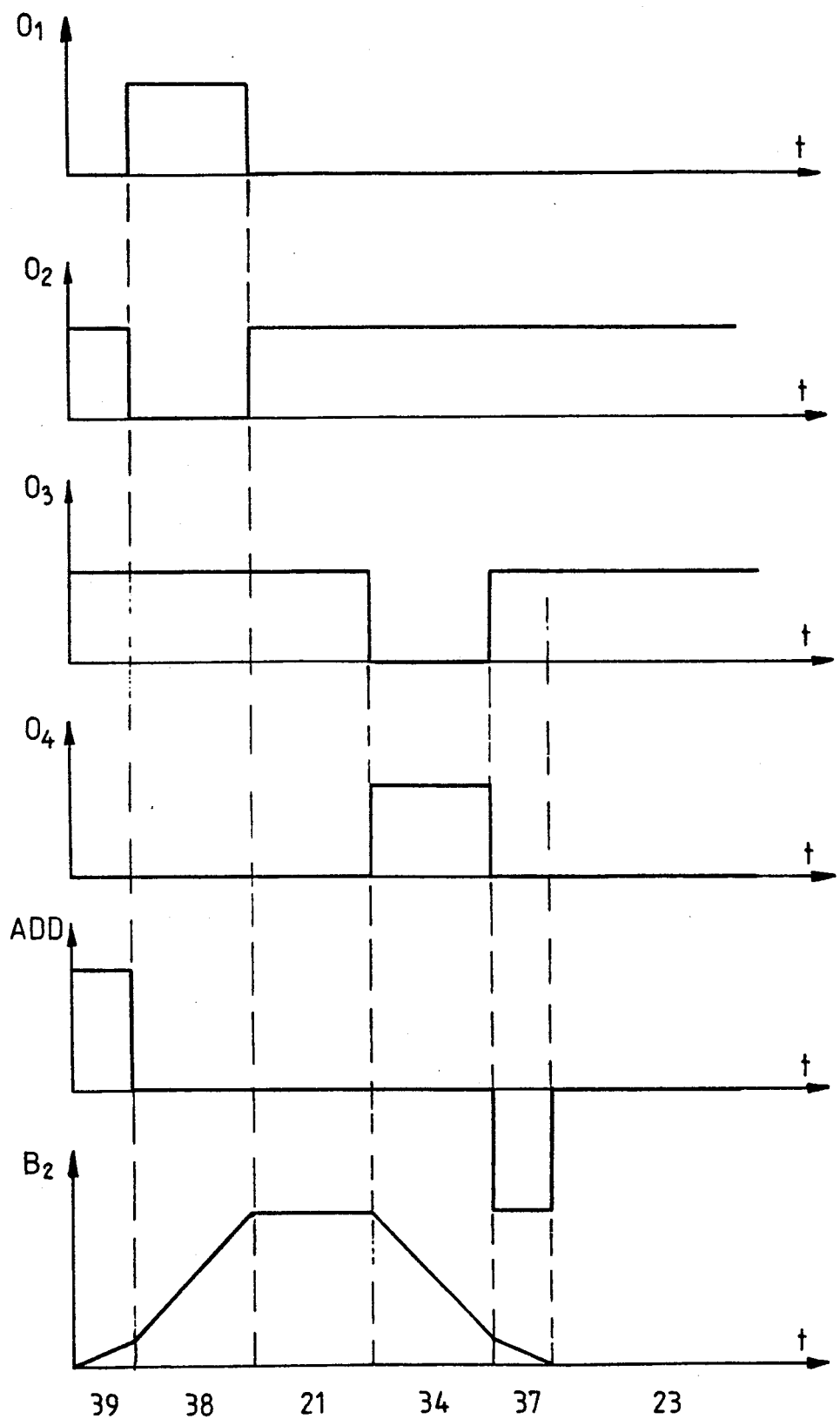
FIG_5

NMR MACHINE WITH LOW FIELD AND DYNAMIC POLARIZATION

BACKGROUND OF THE INVENTION

1. Field of the Invention

The present invention relates to a nuclear magnetic resonance (NMR) machine with low field and dynamic polarization. The NMR machines concerned are more specifically NMR imaging machines which find application in particular in the medical field. The object of the machine in accordance with the invention is to improve the signal-to-noise ratio of the detected signal in order to achieve enhanced sharpness of detail of the images obtained. Moreover, the invention can make a significant contribution to reduction in cost of such machines by simplification of their homogeneity correction coils.

2. Description of the Prior Art

Classically, an NMR machine essentially comprises a magnet, or a coil which performs the same function, in order to subject a body to be examined to an intense and permanent orienting magnetic field. When subjected to this influence, the body is then excited electromagnetically by a high-frequency electromagnetic wave. On completion of the excitation, a measurement is performed on a de-excitation electromagnetic wave which is emitted by the body and provides information on the intimate nature of said body. It is known that the amplitude of the detectable electromagnetic signal in such machines is of the type $\chi B_O^2$. In this expression, $\chi$ is the magnetic susceptibility of the body to be examined and $B_O$ is the intensity of the orienting field of the machine.

Now the amplitude of the noise re-emitted by a body is proportional to $\omega$, where $\omega$ is the resonant angular frequency of the magnetic moments of the body particles when the body is subjected to the influence of the orienting field. The immediate result thereby achieved is that the signal-to-noise ratio of the detectable electromagnetic wave is proportional to $B_O$ since $\omega$ is itself proportional to $B_O$. In the present state of the art, this observation has favored the construction of NMR machines with an orienting field $B_O$ which is as large as possible. This incentive is greater by virtue of the fact that, with a high field, the resistance provided by the antenna in parallel with the resistance offered by the body becomes negligible.

In a high-field machine, the magnetization given to the particles of a body to be scanned is substantial. This magnetization is related to the polarizing force of said field and is stronger as the field is higher. Furthermore, at the moment of excitation, the spins of the particles begin to resonate at a frequency which is also proportional to the orienting field $B_O$. At the moment of excitation, the orienting field therefore performs in addition to its polarizing field function, a second function which is that of a resonance field. Just as the use of a high-intensity orienting field is useful in regard to polarization and magnetization since it increases the amplitude of the detectable signal, so the use of a high field at the moment of resonance is a difficult matter.

In fact, if the orienting field is not perfectly homogeneous, two types of disadvantages accordingly arise. Minor consequences first appear in regard to magnetization (on condition that inhomogeneity is nevertheless not excessive). In fact, this different magnetization at different locations of the machine produces a defect in homogeneity of luminosity of the image which can be arranged. But other more critical consequences affect the detectable electromagnetic signal. In fact, if the resonance field is of the order of 1 Tesla and if the particles examined are hydrogen particles (present in water and therefore in a large quantity in human bodies), the resonance frequency of the spins is of the order of 40 MHz. An inhomogeneity of one millionth of the value of the resonance field therefore produces a resonance deviation of approximately 40 Hz. This means that, at the end of a period of 12.5 ms, contributions to the total NMR signal made by adjacent particles but subjected to resonance fields which differ from each other by one millionth are in phase opposition. The immediate result is that the total electromagnetic signal (the only one which is detectable) is then cancelled.

Phase dispersion of the different contributions to the NMR signal by the signals emitted by the different particles can be countered by the use of two techniques. Firstly, it is possible to adopt a so-called spin echo technique. In this latter, with an additional electromagnetic excitation pulse, one produces after application of the excitation pulse a reflection of the phase dispersion so that the NMR signal reappears at the end of a time interval of double the value of the time interval which elapses between the excitation pulse and the reflection pulse (or so-called echo pulse). This technique suffers from a drawback in that it imposes the use of spin echo pulses. This has the disadvantage in the first place of multiplying the duration of NMR sequences by two and, in the second place, of prohibiting the use of special sequences of the SSFP type, for example, in which it is sought to achieve dynamic equilibrium of magnetization of particles during a series of sequences in order to have a sufficient detectable signal level. Another technique is not concerned with the method of excitation but is rather concerned with fabrication technology. In this technique, inhomogeneity correction coils or so-called shim coils are associated with the magnets and with the coils for production of the orienting field. The practical application of these coils is highly complex. Inhomogeneities of the order of one millionth can be obtained only with great difficulty. Existing NMR machines are therefore difficult to construct, to adjust and to use.

The present invention has for its object to overcome these disadvantages by proposing a different generation of NMR machine which essentially consists in dissociating the polarizing and resonance effects of the orienting field. The main principles of a machine in accordance with the invention consist in subjecting the particles to a high polarizing field of 1 Tesla, for example, whereupon this field is cancelled. The magnetization conferred on the magnetic moments will therefore tend to be damped. But cancellation of the polarizing field will be more rapid than decay of magnetization of the body particles. During decay of said magnetization of the body particles, the effects of another field are employed, namely a so-called resonance field which can be of much lower strength but on the other hand much more homogeneous. By virtue of the fact that the polarizing field is of high strength, the utilizable magnetization is of high value in spite of its decay. The detectable signal is therefore strong.

On the other hand, by reason of the fact that the resonance field is low, the resonance frequency of the NMR signal associated with the excitations is low and the noise is also low. Moreover, since the frequency of the resonance signal is low, the influence of inhomogeneities is proportionally much smaller in respect of experiment times of the same order as before. In fact, if a resonance field of 100 Gauss is chosen instead of one Tesla, the resonance frequency will be divided by 100 and the time interval after which the signals from regions of the space in which inhomogeneities of one millionth prevail will now oppose their contributions only after a time interval which is one hundred times longer. The same signal-to-noise ratio for a given polarization is therefore retained but an advantage is also offered in regard to the need to reduce the inhomogeneities of the resonance field. Moreover, a high inhomogeneity of the polarizing field can be tolerated even if it has a value of the order of 3 dB, for example, since it only has the effect of unobjectionable weighting of the detected signal.

SUMMARY OF THE INVENTION

The invention is therefore directed to an NMR machine comprising
means for subjecting a body to be scanned to an intense magnetic polarization field,
means for exciting said body with an electromagnetic wave,
means for measuring an electromagnetic wave re-emitted in response by the body,
said machine being distinguished by the fact that it comprises in addition
means for producing a resonance field which is of distinctly lower strength than the polarization field,
and means for cancelling the polarization field prior to measurement of the electromagnetic wave within the body.

Preferably, cancellation of the polarizing magnetic field will take place even before electromagnetic excitation. In view of the fact that the homogeneity of the intense polarization field does not need to be perfect, there is chosen in order to simplify the construction a coil for the production of said polarization field which does not have high self-inductance and which is consequently not very homogeneous. On the other hand, the homogeneity of the resonance field will be much higher than that of the polarizing field. Moreover, taking into account the fact that the resonance field is low and that the frequency of the resonance electromagnetic wave is also low, it becomes necessary to employ antennas which offer low resistance in parallel with that of the body. Preferably, the antennas for excitation and detection of the electromagnetic signal will be of the superconducting type. The invention is preferably employed in an NMR imaging machine. This imaging machine serves to apply series of sequences of excitation-measurement of the electromagnetic wave within the body and the polarization field will preferably be re-established periodically.

BRIEF DESCRIPTION OF THE DRAWINGS

FIG. 1 illustrates an NMR machine in accordance with the invention.

FIGS. 2a to 2f are time diagrams of signals which can be employed in an imaging sequence with the machine in accordance with the invention.

FIG. 3 is a diagram which is representative of the progressive variation in magnetization during switching of the polarization field.

FIG. 4 is an improved generator for supplying a coil for the production of a magnetic polarization field in accordance with the invention.

FIG. 5 groups together a number of time diagrams showing the operation of the supply circuit of FIG. 4.

DETAILED DESCRIPTION OF THE INVENTION

FIG. 1 shows an NMR machine in which provision is made for a set of coils 1 and 2 supplied by a generator 3 for subjecting a body 4 to be scanned to an intense magnetic polarization field $B_2$. In the example shown, the field $B_2$ is oriented in the direction of the Y-axis. The machine also has an antenna 5 supplied by a generator 6 for exciting the body 4 with an electromagnetic wave. A receiver 7 coupled to the antenna 5 for example by means of a duplexer 8 serves to measure the electromagnetic wave re-emitted in response by the body 4. In an imaging experiment, the receiving circuit 7 also performs a treatment so as to represent an image of a cross-section of the body 4 on a display device 9. In a known manner, in order to produce these images, the NMR imaging experiment thus undertaken must involve a series of excitation-measurement sequences during which additional magnetic field pulses are applied to the body 4 by a set of gradient coils 10 supplied by a gradient coil generator 11. The definition of the NMR machine described thus far is conventional.

In the invention, the generator 3 is designed to be cut-off. Another set of coils 12 to 15 supplied by a generator 16 is intended to subject the body 4 to a resonance magnetic field $B_O$ which is distinctly lower than the field $B_2$. In a preferred manner, and taking into account its low value, the field $B_O$ will be maintained permanently without any problem. Also in a preferred manner, the field $B_O$ produced by the coils 12 to 15 is relatively much more homogeneous than the field $B_2$ in an examination zone 17 opposite to the antenna 5.

In one example, the intensity of the switched field $B_2$ is of the order of 2 Teslas when said field is present and of course zero when it is interrupted. The field $B_O$ is of the order of 100 Gauss. In a known manner, the machine equipment as a whole operates under the control of a sequencer 18 which organizes the functional and time dependence of all these elements. In order to initiate periodic control of the generator 3, it is only necessary to connect said generator functionally to the sequencer 18.

In order to obtain a very homogeneous field $B_O$, it may be found sufficient to adopt a solution which consists in placing a coil for the production of said field at a substantial distance from the zone 17. Under these conditions, the field induced by said coil within said zone 17 will be low but on the other hand very homogeneous. It is possible and in fact preferable to employ coils which have already been developed earlier for conventional NMR machines. The coils in this case are supplied with current of much lower intensity than the current for which they were designed. The reason for this is that, with these coils, it is no longer sought to induce a strong polarization field at the same time. In the final analysis, it may be sufficient to employ for the field $B_O$ the coils of machines already constructed and to pass through these coils currents which are two hundred times lower, for example.

For the production of the intense magnetic polarization field $B_2$, taking into account the fact that it must permit of very rapid switching, coils having the smallest possible number of turns are chosen. These coils thus have a minimum value of self-inductance in order not to prevent the formation of said polarization induction field as well as interruption of said field. Such a solution can be retained since the field $B_2$ must essentially be of large amplitude and permit relatively fast switching but does not need to be very homogeneous. Preferably, the field $B_2$ may also exert its influence only within the imaging volume 17. Under these conditions, the coils 1 and 2 are small. In order to ensure the greatest possible nullity of the field $B_2$, this latter is so oriented as to be perpendicular to $B_O$ in the image zone 17. Apart from the fact that this has the effect of making the field negligible at the moment of cancellation, this solution permits easy positioning of the coils 1 and 2 within the tunnel of the NMR machine in such a manner as to ensure that the field $B_2$ is perpendicular to the lengthwise direction of the body 4. The field $B_O$ in this case is longitudinal.

FIG. 2 represents the time diagrams of signals which can be employed in the present invention. FIG. 2a shows that the resonance field $B_O$ is preferably maintained continuously. On the other hand, in FIG. 2b, the polarization field $B_2$ is established during a period 20, is maintained during a period 21 and is subjected to an interruption during a period 22. The field remains interrupted during a period 23. Taking into account an imposed standard in experiments on human beings which limits the increase in magnetic fields to 20 Teslas per second, a rise time of 100 ms can be chosen for establishing a nominal field $B_2$ at 2 Teslas. In the case of volumes of interest 17 of the order of 20 cm in diameter, the switched powers are of the order of 200 kVA in respect of plateau regions 21 of the order of 2 Teslas at 100 ms. These powers are multiplied by 3 to 4 if the diameter of the useful zone 17 increases to 30 cm.

It will be assumed that, during the period 22, the magnetization M of the magnetic moments of the particles tilts as indicated in FIG. 3 so as to be aligned with the resonance field $B_O$. At the beginning of the period 22, the magnetization M is aligned in accordance with the vectorial composition of the fields $B_2$ and $B_O$ together during the period 21. By virtue of the fact that $B_2$ is of much higher value than $B_O$ at the beginning of the period 22, the magnetization M is practically collinear with $B_2$. It is noted that the magnetization M naturally decays to a slight extent during the period 22. During the period 23, when the magnetization M is collinear with $B_O$, it is possible to subject the portion contained in the zone 17 of the body 4 to an imaging sequence.

FIGS. 2c to 2f show an imaging sequence of this type with an imaging method of the type designated as 2DFT with spin echos. Thus a radio-frequency electromagnetic excitation 25 is applied to the body 4 by the antenna 5 in the presence of a pulse 26 of a cross-section selection gradient along the axis Z. In this example, transverse cross-sections are made. After excitation, there is applied a pulse 27 of a phase coder gradient oriented along the axis Y. The particular feature of this phase coding excitation lies in the fact that, from one sequence to another in the series of sequences which serve to form the image, the value of said pulse 27 varies. In order to produce a reflection of the phase dispersion of the NMR signals re-emitted by the body, a radio-frequency electromagnetic pulse 28 or so-called spin echo pulse is applied in the presence of a pulse 29 of re-selection of the same cross-section with the cross-section coding gradient $G_z$. At the end of a period which is double (2 T) the time interval between the two excitation pulses 25 and 28, the regenerated NMR signal 30 is measured in the presence of a reading pulse 31 on a reading gradient $G_x$.

These sequences are known. In particular, the cross-section selection pulse 26 comprises a consecutive cross-section recoding pulse 32 and the pulse 31 is in turn preceded by a reading precoding pulse 33. If the period 23 has a duration of the order of 100 ms, it may even be planned to carry out during this period 23 a number of successive sequences which are similar to those of FIGS. 2c to 2f. For example, if a sequence of this type has a time-duration of the order of 25 ms, it can be repeated four times. It is chosen in this case, however, to produce an image in another cross-section with a cross-section selection pulse other than the pulse 26. It is of interest to note that, during this period 23, it is in fact possible to carry out all methods of excitation and to apply all methods of imaging which are already known in the present state of the art.

FIG. 3 shows that the magnetization M, that the magnetic moments of the particles, retain substantially the same values during interruption of the polarization field $B_2$. Only their orientations change. However, this change of orientation, this vectorial rotation of M, is possible only if the rotation of the vector B resulting from the algebraic composition of $B_2$ and of $B_O$, is small in comparison with the resonance frequency and the precession frequency of the magnetic moments. This precession frequency is in turn proportional on the one hand to B and on the other hand to $\gamma$, where $\gamma$ is the gyromagnetic ratio associated with the particles examined (namely hydrogen particles in medical imagery). In the final analysis, it is therefore necessary to ensure that the angular velocity of B is considerably lower than $\gamma B$. However, $\gamma B$ is itself limited in its lower values by $\gamma B_O$. In fact, when $B_2$ is zero, $\gamma B$ becomes identical with $\gamma B_O$. With a $B_O$ of 100 Gauss as considered thus far, and by choosing a ratio of one thousand between the angular velocity of B and the resonance frequency, there is obtained a minimum duration of decay, namely a minimum duration of the period 22 which is equal to 25 ms. In practice, the problem is not so simple. In fact, at the beginning of decay (linear decay, for example) of $B_2$, the orientation of the magnetization M remains practically unchanged by virtue of the fact that $B_2$ is very large with respect to $B_O$. It is only towards the end of the period 22 when $B_2$ becomes of the order of $B_O$ that it becomes necessary to slow-down the decay of $B_2$. It can be indicated that the angular velocity of M becomes of maximum value at the moment when $B_2$ is zero and that it is accordingly equal to $$(dB_2/dt)/B_O.$$

In consequence, it will therefore be necessary to slow-down more progressively at the end of the decay of $B_2$ during the period 22. Since the same phenomenon applies to the increase, it will be necessary to ensure that the rise of $B_2$ during the time interval 20 takes place more slowly at the beginning but at a higher rate at the end.

The question which therefore arises is to know at which moment during the decay 22 it is necessary to begin a less rapid decrease. The answer is as follows: the decay must be slowed-down when the decaying field $B_2$ becomes of the same order as $B_O$. Thus during a period 22 of the order of 100 ms, it is an advantage to cause $B_2$ to decay with a gradient of 20 Teslas per second over a period of 99 ms. During a following period such as 5 ms, for example, the field $B_2$ is caused to decay from the value of 200 Gauss which it had attained down to 0. It can be shown that, under these conditions, the orientation of the magnetization M of the magnetic moments is not displaced with respect to the orientation of the vector composition $B_O + B_2$.

In order to produce this decay in two stages, it will be possible to employ a supply comprising a switching circuit 35 (shown in FIG. 4) which is capable of producing +V or +V volts during a time interval 34 of the period 22 or a time interval 38 of the period 20, or else a voltage of 0 volt during the periods 21 and 23. Said circuit 35 is a floating circuit and subjects the inductance coils 1 and 2 to a constant voltage. Preferably, these inductance coils are superconducting coils. Said inductance coils 1 and 2 therefore allow a linearly increasing current to pass when they are subjected to a constant voltage and therefore produce a linearly rising field. The circuit 35 comprises two double bridges of transistors in series. A first double bridge 40 is formed by the bridges 41 and 42. The bridge 41 comprises the transistors 43 and 46. The bridge 42 comprises the transistors 44 and 45. The second double bridge 47 is constituted by the bridges 48 and 49. The bridge 48 comprises the transistors 50 and 53. The bridge 49 comprises the transistors 51 and 52. All the transistors are provided with a reverse destorage diode. The two double bridges are mounted in series in their mid-point, each with a battery 54 and 55 respectively. According to the direction of conduction of the current within the bridges, the voltages delivered by these batteries are either added or neutralize each other. Moreover, an adder 56 is placed in series with the double bridges and the coils 1 and 2. Said adder produces a voltage step which can be utilized for creating the small ramps during the periods 39 and 37.

FIG. 5 shows orders $O_1$, $O_2$, $O_3$ and $O_4$ which are applicable to the bridges 41, 42, 48, 49 respectively. The ADD signal is the signal which is produced by the sequencer 18, for example, and is intended to be added within the adder 56 to the 0-volt voltage produced by the batteries. Thus during the period 39, the ADD signal is applied whilst the conduction established between the bridges 42 ($O_2$) and 48 ($O_3$) causes neutralization of the two equal voltages V delivered by each of the batteries 54 and 55. During the period 38, the ADD signal is interrupted, the bridge 42 ($O_2$) is cut-off whilst the bridge 41 ($O_1$) is conducting and the bridge 48 ($O_3$) remains in the conducting state. Under these conditions, a voltage of +2 V (typically 320 volts) is applied to the coils 1 and 2. During the period 21, the bridges 41 and 42 are again reversed. A constant current accordingly continues to pass through the coils 1 and 2. During the period 34, the bridges 48 ($O_3$) and 49 ($O_4$) are reversed. A voltage of −2 V is supplied: the current within the coils 1 and 2 decreases. During the period 37, the bridges 48 and 49 are again reversed (the voltages of the batteries are neutralized) whilst an ADD signal having reversed polarity is applied by means of the adder 56. The current within the coils 1 and 2 falls to zero. During the period 23, the circuit 35 is in the same configuration as during the period 21 (but during this period, there is no longer any flow of current within the coils 1 and 2).

Should it be chosen to give $B_2$ the same orientation as $B_O$ in accordance with the possibility which is offered, the magnetization problems no longer arise. It is nevertheless necessary in such a case to take into account the coupling between the coils 1 and 2 and 12 to 15.

A point worthy of note is that it is also possible to employ the windings 1 and 2 as a replacement for the antenna 5.

The resonance field $B_O$ cannot be as weak as may be desired. In fact, the gradients produce a variation of the magnetic field to which the particles are subjected during the experiment. If, in respect of a gradient of a given force, there is obtained a variation B at the limit of the image zone, it is necessary to ensure that $B_O$ is at least equal to double B in order to guard against phenomena of frequency reversal of the radio-frequency signals detected at the moment of processing. In practice, this proposition is more readily satisfied if low-power gradients are also employed with a low resonance field $B_O$. In fact, the use of gradients of unduly high power would no longer make it possible to consider as negligible the component of the magnetic fields of the gradients which is not oriented longitudinally with said resonant field. In this case, it is possible to choose at the limit of the scanning zone 17 an influence of the gradients having a magnitude, with respect to the resonant field, of the same order as the influence which, in the prior art, the gradients had with respect to the polarization and resonance field. However, in order to derive maximum benefit from the advantage provided by the machine in accordance with the invention, it is preferable to use relatively higher gradients. The maximum effect of the gradients is usefully limited to one tenth of the value of the resonance field $B_O$. It therefore proves necessary to produce less powerful gradients (with supplies of lower value) which, paradoxically, will have a greater effect of differentiation between the different frequency components of the NMR signal. These gradients together with their associated supplies are not only less costly but also have higher performances. In practice, existing gradients are retained with their supply and their mode of utilization and a field $B_O$ is chosen having a strength which is ten times that of the field produced by the gradients at the limit of their zone of influence. This makes it possible to retain all the constraints related to the creation of images.

Taking into account the fact that, at low resonance frequency, the impedance of the antenna 5 is no longer negligible in comparison with the impedance presented by a patient's body, the impedance of said antenna must be relatively reduced. It is preferable to choose an antenna of the superconducting type. In this case, said antenna is coupled with a cooled amplifying head of the type employed in space communications.

Whereas the field $B_O$ is preferably maintained continuously, the field $B_2$ is established periodically. The duration of the periodic cycle for establishing the field $B_2$ is preferably chosen equal to a repetition time Tr which is in turn determined for a particular method of imaging. For example, if it is desired to produce images in spin-spin relaxation time ($T_2$), it is an advantage to choose repetition times Tr of the order of 1 or 2 seconds. Should it be desired to produce images in spin-lattice relaxation time ($T_1$), it is preferable to choose repetition times Tr of the order of 200 to 400 ms, depending on the nature of the materials to be examined. These times are wholly compatible with the indications given in the foregoing.

It is observed that the mean magnetization of the magnetic moments is not equal to the value which they would have if the plateau regions 21 were continuously maintained. It is rather equal to or less than the mean magnetization which they would have for one-half this value.

What is claimed is:

1. An NMR machine comprising
   means for subjecting a body to be scanned to an intense magnetic polarisation field,
   means for exciting said body with an electromagnetic wave,
   means for measuring an electromagnetic wave re-emitted in response by the body, wherein said machine comprises in addition
   means for producing a resonance field of distinctly lower strength than, and orthogonal to the polarisation field,
   and means for cancelling the polarisation field prior to measurement of the electromagnetic wave, including means for damping the cancellation.

2. A machine according to claim 1, wherein said machine comprises means for cancelling the polarisation field prior to excitation.

3. A machine according to any one of claims 1 or 2, wherein means are provided for ensuring that the resonance field is, relatively, distinctly more homogeneous than the polarisation field.

4. A machine according to claim 3, wherein the means for excitation and measurement of the electromagnetic wave comprise a superconducting antenna.

5. A machine according to claim 3, wherein the means for subjecting the body to be scanned to a polarisation field and the means for cancelling said polarisation field comprise a thyristor supply.

6. A machine according to claim 3, wherein said machine is an imaging machine for carrying out series of sequences for excitation-measurement of the electromagnetic wave and wherein said machine comprises means for periodically re-establishing the polarisation field.

7. A machine according to claim 2, wherein the means for excitation and measurement of the electromagnetic wave comprise a superconducting antenna.

8. A machine according to claim 2, wherein the means for subjecting the body to be scanned to a polarisation field and the means for cancelling said polarisation field comprise a thyristor supply.

9. A machine according to claim 2, wherein said machine is an imaging machine for carrying out a series of sequences for excitation-measurement of the electromagnetic wave and wherein said machine comprises means for periodically re-establishing the polarisation field.

10. A machine according to any one of claim 1, wherein the means for excitation and measurement of the electromagnetic wave comprise a superconducting antenna.

11. A machine according to claim 10, wherein the means for subjecting the body to be scanned to a polarisation field and the means for cancelling said polarisation field comprise a thyristor supply.

12. A machine according to claim 10, wherein said machine is an imaging machine for carrying out a series of sequences for excitation-measurement of the electromagnetic wave and wherein said machine comprises means for periodically re-establishing the polarisation field.

13. A machine according to claim 1, wherein the means for subjecting the body to be scanned to a polarisation field and the means for cancelling said polarisation field comprise a thyristor supply.

14. A machine according to claim 13, wherein said machine is an imaging machine for carrying out a series of sequences for excitation-measurement of the electromagnetic wave and wherein said machine comprises means for periodically re-establishing the polarisation field.

15. A machine according to claim 1, wherein said machine is an imaging machine for carrying out a series of sequences for excitation-measurement of the electromagnetic wave and wherein said machine comprises means for periodically re-establishing the polarisation field.

16. An NMR machine comprising:
   a. means for subjecting a body to be scanned to an intense magnetic polarisation field;
   b. means for exciting said body with an electromagnetic wave;
   c. means for measuring an electromagnetic wave re-emitted in response by the body;
   wherein said machine comprises in addition:
   d. means for producing a resonance field of distinctly lower strength than, and orthogonal to, the polarisation field;
   e. and means for canceling the polarisation field prior to measurement of the electromagnetic wave, including means for damping the cancellation;
   and wherein said machine is an imaging machine for carrying out a series of sequences for excitation-measurement of the electromagnetic wave and wherein said machine comprises means for periodically reestablishing the polarisation field.

17. The machine according to claim 16, wherein said machine comprises means for cancelling the polarisation field prior to excitation.

18. The machine according to claim 16, wherein means are provided for ensuring that the resonance field is, relatively, distinctly more homogeneous than the polarisation field.

19. An NMR machine comprising:
   a. means for subjecting a body to be scanned to an intense magnetic polarisation field;
   b. means for exciting said body with an electromagnetic wave;
   c. means for measuring an electromagnetic wave re-emitted in response by the body;
   wherein said machine comprises in addition:
   d. means for producing a resonance field of distinctly lower strength than, and orthogonal to, the polarisation field;
   e. and means for cancelling the polarisation field prior to measurement of the electromagnetic wave, including means for damping the cancellation;
   and wherein said machine comprises means for cancelling the polarisation field prior to excitation.

20. A machine according to claim 19, wherein means are provided for ensuring that the resonance field is, relatively, distinctly more homogeneous than the polarisation field.

21. A machine according to claim 19, wherein the means for subjecting the body to be scanned to a polarisation field and the means for cancelling said polarisation field comprise a thyristor supply.

22. An NMR machine comprising means for subjecting a body to be scanned to an intense magnetic polarisation field, means for exciting said body with an electromagnetic wave, means for measuring an electromagnetic wave re-emitted in response by the body, means for producing a resonance field of distinctly lower strength than the polarisation field, means for cancelling the polarisation field prior to excitation of the electromagnetic wave wherein said machine comprises in addition means for producing a polarisation field at right angles to the resonance field, said means for cancelling the polarisation field comprising means for damping the cancellation.

23. A machine according to claim 22, wherein means are provided for ensuring that the resonance field is, relatively, distinctly more homogeneous than the polarisation field.

24. A machine according to claim 22 or 23, wherein the means for excitation and measurement of the electromagnetic wave comprise a superconducting antenna.

25. A machine according to claim 22 or 23, wherein the means for subjecting the body to be scanned to a polarisation field and the means for cancelling said polarisation field comprise a thyristor supply.

26. A machine according to claim 22 or 23, wherein said machine is an imaging machine for carrying out a series of sequences for excitation-measurement of the electromagnetic wave and wherein said machine comprises means for periodically re-establishing the polarisation field.

* * * * *